(12) United States Patent
Marchant et al.

(10) Patent No.: US 9,449,118 B2
(45) Date of Patent: Sep. 20, 2016

(54) HYBRID HIDDEN-LINE PROCESSOR AND METHOD

(75) Inventors: Gary LaMont Marchant, Milford, OH (US); Shailesh Ratnakar Karmalkar, Mason, OH (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 680 days.

(21) Appl. No.: 13/248,071

(22) Filed: Sep. 29, 2011

(65) Prior Publication Data

US 2013/0083022 A1    Apr. 4, 2013

(51) Int. Cl.
  *G06T 15/40*    (2011.01)
  *G06F 17/50*    (2006.01)

(52) U.S. Cl.
  CPC ............. *G06F 17/50* (2013.01); *G06T 15/405* (2013.01)

(58) Field of Classification Search
  CPC ....... G06T 15/04; G06T 11/40; G06T 17/20; G06T 15/405; G06T 2210/12; A63F 13/10; A63F 13/00; G06F 17/50; G06F 17/30654; G02B 2027/0178
  USPC .......................................................... 345/421
  See application file for complete search history.

(56) References Cited

U.S. PATENT DOCUMENTS

| | | | | |
|---|---|---|---|---|
| 5,359,704 A | * | 10/1994 | Rossignac ............ | G06T 15/405 345/422 |
| 5,377,313 A | * | 12/1994 | Scheibl ........................ | 345/422 |
| 6,226,003 B1 | * | 5/2001 | Akeley ......................... | 345/419 |
| 6,535,219 B1 | * | 3/2003 | Marshall et al. ............. | 345/581 |
| 7,948,489 B1 | | 5/2011 | Barnes et al. | |
| 8,217,936 B1 | * | 7/2012 | Barnes et al. ................ | 345/423 |
| 2003/0227464 A1 | * | 12/2003 | Lee .................. | 345/584 |
| 2005/0041022 A1 | * | 2/2005 | Blot et al. ..................... | 345/421 |

FOREIGN PATENT DOCUMENTS

| | | |
|---|---|---|
| JP | 5-73693 A | 3/1993 |
| JP | 2004318825 A | 11/2004 |

OTHER PUBLICATIONS

Cohen-Or, D et al.: "A Survey of Visibility for Walkthrough Applications", IEEE Transactions on Visualization and Computer Graphics, IEEE Service Center, Los Alamitos, CA, US, vol. 9, No. 3, Jul. 2003, pp. 412-431, XP002383736, ISSN 1077-2626. (22 pages).

(Continued)

*Primary Examiner* — Gregory J Tryder
*Assistant Examiner* — Kwang Lee

(57) ABSTRACT

A method for providing hybrid hidden-line processing for a plurality of polygons representing tessellated image data, wherein each polygon comprises a plurality of edges, is provided. The method includes generating a back-facing plate comprising polygons on a back-facing side of a silhouette of the tessellated image data and a front-facing plate comprising polygons on a front-facing side of the silhouette of the tessellated image data. The method includes tracing the edges and identifying at least one visibility change pixel in each of a subset of the traced edges. The method includes, for each visibility change pixel, determining whether the traced edge is from the same plate as a polygon corresponding to the visibility change pixel. The method includes, for each traced edge that is determined to be from the same plate as the polygon corresponding to the visibility change pixel, displaying the traced edge.

20 Claims, 7 Drawing Sheets

(56) References Cited

OTHER PUBLICATIONS

Isenberg, Tobias et al.: "A Developer's Guide to Silhouette Algorithms for Polygonal Models", IEEE Computer Graphics and Applications, IEE Service Center, New York, NY, US vol. 23, No. 4, Jul. 2003, pp. 28-37, ZP011097699. (10 pages).
PCT Search Report dated Sep. 1, 2014, for application No. PCT/US2012/056620. (12 pages).
PCT International Search Report mailed Dec. 18, 2012 in connection with PCT International Application No. PCT/US2012/057182 filed Sep. 26, 2012 (3 pages).
Written Opinion of the International Searching Authority dated Dec. 18, 2012 in connection with International Application No. PCT/US2012/057182 (5 pages).
"Plan Design FT V2.5" Dokumentationen Nemetschek Technology, XX, XX, Dec. 1, 2000, (180 pages).
Anonymous: "Kurzvorstellung PlanTeam-Server", Jun. 1, 2010, (pp. 1-26), Berlin, Germany, http://www.weltweitbau.de/de/PlanTeam-Server/Kurzvorstellung_PlanTeam-Server.pdf.
W. Heger, "Vector and Hidden Line Removal and Fractional Quantitative Invisibility", http://www.geocities.com/SiliconValleyNetwork/6147/vhl.htm, May 2004, pp. 1-9.
M. de Berg, et al. "Efficient Ray Shooting and Hidden Surface Removal", Algorithmica, Dec. 1994, pp. 30-53.
P. K. Agarwal, et al. "Can Visibility Graphs Be Represented Compactly", Discrete & Computational Geometry, Dec. 1994, pp. 347-365.
M. H. Overmars,et al. "An Improved Technique for Output-Sensitive Hidden Surface Removal", Algorithmica, Nov. 1994, pp. 469-484.
X. Tan, T. Hirata, et al "Designing Efficient Geometric Search Algorithms Using Persistent Binary-Binary Search Trees" Transctns on Fndmntl of Elctrnics Apr. 1994, pp. 601-607.
M. T. Goodrich, M. J. Atallah, and M. Overmars, "Output-Sensitive Methods for Rectilinear Hidden Surface Removal", Information and Computations, 107, 1993, pp. 1-24.
B. Chazelle, "An Optimal Algorithm for Intersecting Three-Dimensional Convex Polyhedra", Society for Industrial and applied Mathematics, vol. 21, No. 4, Aug. 1992, pp. 671-696.
D. P. Dobkin, "Computational Geometry and Computer Graphics", Proceedings of the IEEE, vol. 80, No. 9, Sep. 1992, pp. 1400-1411.
M. T. Goodrich, "A Polygonal Approach to Hidden-Line and Hidden-Surface Elimination", Graphical Models and Image Processing, vol. 54, No. 1, Jan. 1992, pp. 1-12.
C. Karakas, "Hidden-Line Algorithm Based on Range Searching", Computer Aided Design (UK), vol. 23, No. 10, Dec. 1991, pp. 684-691.
H. M. Chen et al. "An Ingenious Algorithm for Hidden-Surface Removal", Second International Conference on Computer-Aided Design and Computer Graphics 1991, pp. 159-164.
H. Schipper et al. "Dynamic Partition Trees", 2nd Scandinavain Workshop on Algorithm Theory Proceedings, 1989, 13 pages.
C. M. Hoffmann et al, "Visualization of Surfaces in Four-Dimensional Space", Technical Report CST-TR-960, CAPO Report CER-90-12, Mar. 1990 20 pages.
R. V. Kleij et al., "A CSG Scan-line Algorithm for quadrics" Reports of the Faculty of Technical Mathematics and Informations No. 90-90, Delft 1990,12 pages.
S. M. Maghrabi et al., "Removal of Hidden Lines by Recursive Subdivision", Computer Aided Design, vol. 21, No. 9, Nov. 1989, pp. 570-576.
J. Zhang, "A Fast Hidden Line Removal Algorithm", New Advances in Computer Graphics. Proceedings of Computer Graphics International, 1989, pp. 591-602.
H. Bingrong, et al. "A New Scheme for Hidden Line Removal Algorithm in Polyhedron", Proceedings of Beijing International Conference on System Simulation . . . ;1989, pp. 245-248.
F.L. Devai "A Lower Bound on Expected Time for the Exact Hidden-Line Problem" Proceeding of the 2nd International Conference Pixim 89 Cmptr Graphics in Paris 1989 pp. 483-493.
M. S. Paterson et al. "Binary Partitions with Applications to Hidden-Surface Removal and Solid Modeling", Proceedings of the Fifth Annual Symposium on Computatn 1989 pp. 23-32.
O. S. Kislyuk "Three Hidden-Line Elimination Algorithms for the Construction of Images of Parametrically Dfined Surfaces" Cmptr Grphcs Frum vol. 7 No. 4 Dec. 1988 pp. 51-53.
L. Li, "Hidden-Line Algorithm for Curved Surfaces", Computer Aided Design, Vo. 20, No. 8, Oct. 1988, pp. 466-470.
S. H. Lo, "A Hidden-line Algorithm Using Picture Subdivision Technique", Computers & Structures, vol. 28, No. 1, 1988, pp. 37-45.
R. H. Guting et al, "New Algorithms for Special Cases of the Hidden Line Elimination Problem" Computer Vision Graphics and Image Processing, vol. 40, No. 2, Nov. 1987pp. 188-204.
T. Kamada et al, "An Enhanced Treatment of Hidden Lines", ACM Transactions on Graphics, vol. 6, No. 4, Oct. 1987, pp. 308-323.
M. T. Goodrich "A Polygonal Approach to Hidden-Line Elimination" Proceedings of the Twenty-Fifth Annl Allerton Confrnce on Communications Cntrl and Comptng Oct. 1987 pp. 849-858.
J. Rankin, "A Geometric Hidden-Line Processing Algorithm", Computers & Graphics, vol. 11, No. 1, 1987, pp. 11-19.
W. R. Spillers and K. H. Law, "On the Hidden Line Removal Problem", Computers & Structures, vol. 26, No. 4, 1987, pp. 709-717.
M. Mckenna, "Worst-Case Optimal Hidden-Surface Removal", ACM Transaction on Graphics, vol. 6, No. 1, Jan. 1987, pp. 19-28.
P.J. Willis, "A Review of Recent Hidden Surface Removal Techniques", Displays, Jan. 1985, pp. 11-20.
G. Cisneros and N. Garcia, "Three-Dimensional Pictures With Curves and Surfaces in Parametric Coordinates", MELECON '85, vol. II: Digital Signal Processing, 1985, pp. 213-216.
C. B. Jones, "A New Approach to the Hidden-Line Problem", The Computer Journal, vol. 14, No. 3, Jun. 1970, pp. 232-237.
J. G. Griffiths, "Bibliography of Hidden-Line and Hidden-Surface Algorithms", Computer Aided Design, vol. 10, No. 3, May 1978, pp. 203-206.
W.R. Franklin et al, "Adaptive Grid for Polyhedral Visibility in Object Space an Implementation", The Computer Journal, vol. 31, No. 1, Feb. 1988, pp. 56-60.
Masatoshi Niizeki and Fujio Yamaguchi, "Projectively Invariant Intersection Detections for Solid Modeling", ACM transactions on Graphics, vol. 13, No. 3 Jul. 1994, pp. 203-226.
K. Mulmuley, "An Efficient Algorithm for Hidden Surface, Removal", Computer Graphics, vol. 23, No. 3, Jul. 1989, pp. 379-388.
B. Chazelle, "An Optimal Algorithm for Intersecting Line Segments in the Plane", Journal of ACM, vol. 39, No. 1, Jan. 1992, pp. 1-54.
R. V. Kleij "Implementation os a Solid Modeling System with Quadric Surfaces" Rprts of the Fclty of Tchncal Mthmtics and Informatics No 90-41 Delft 1990 ISSN0922-5641 21 pgs.
R. Walter, "Visibility of Surfaces Via Differential Geometry", Computer Aided Geometric Design 7, 1990, pp. 353-373.
P. K. Agarwal et al, "Applications of a New Space-PartitioningTechnique", Discrete & Computational Geomertry, vol. 9, No. 1, 1993 pp. 11-38.
W. Hsu et al, "An Algorithm for the General Solution of Hidden Line Removal for Intersecting Solids", Computer Graphics (UK), vol. 15, No. 1, 1991, pp. 67-86.
Bala R. Vatti, "A Generic Soluton to Polygon Clipping", Communications of the ACM, vol. 35, No. 7, Jul. 1992, pp. 56-63.
Teschner et al., "Optimized Spatial Hasing for Collision Detection of Deformable Objects", VMV Nov. 19-21, 2003, Munich Germany, 8 pages.
Dean et al, "Efficient Hidden-Line Elimination by Capturing Winding Information" 23rd Allerton Conference on Communication, Control and Computing, III., Oct. 1985, pp. 496-505.
James Blinn, "A Trip Down the Graphics Pipeline: Grandpa, What Does "Viewport" Mean?", vol. 13, No. 3, Jan. 1992, pp. 5
Chen Lixing "An Algorithm for Hidden Surface Elimination", Computer Center-South China University of Technology, GuangZhou, China, pp. 70-77.

(56) References Cited

OTHER PUBLICATIONS

Piet Houthuys, "Box Sort, A Multidimensional Binary Sorting Method for Rectangualr Boxes, Used for Quick Range Searching", The Visual Computer 1987, pp. 236-249.
Brkic et al., "A Variation of Encarnacao's Scan-Grid Method" Automatika 25 (1984), 1-2, pp. 101-106, YU ISSN 0005-1144.
Beiji et al. "Solid Modeling System (ASMS) Using Albebraic Method" Department of Computer Science and Technology, Tainghua University, China, IEEE 1985, pp. 812-816.
Robert M. Brown , "Hidden-Line Removal at 20 Pictures/Second through Hybrid Techniques" Computer Sciences Corporation, Huntsville Alabama, pp. 192-204.
Woon et al "A Procedure for Generating Visible-Line Projections of Solids Bounded by Quadric Surfaces" Cmptr Scncs Dpt, IBM Thomas J. Rsrch Cntr, Inf Procsng 71 pp. 1120-1125.
IBM Technical Disclosue Bulletin, "Hidden Line Elimination for Complex Surfaces", vol. 18, No. 11, Apr. 1976, pp. 3873-3876.
Vesna Mihajiovic Levi, "Hidden Line Algorithm for Convex Penetrating Polyhedral Objects", Faculty of Technical Scncs, Unvsty of Novi Sad, YU, pp. 60-69.
A. Ricci, "An Algorithm for the Removal of Hidden Lines in 3D Scenes" CNEN Centro ki Clcolo, Via Mazzini 2, Bologna Italy, Dec. 1970, pp. 375-377.
Berg et al., "Computing and Verifying Depth Orders", Siam J. Comput, vol. 23, No. 2, pp. 437-446, Apr. 1994, Society for Industrial and Applied Mathematics.
Fuyan, et al., "An Algorithm for Hidden Line Removal Via Overlapping Views", Nanjing University, 1990, pp. 717-720.
Jiri Kripac, "Algorithm for Splitting Planar Faces", Butterworth & Co 9publishers) Ltd, vol. 19 No. 6, Jul./Aug. 1987, pp. 293-298.
Samet et al., "Hierarchical Data Structures and Algorithms for Computer Graphics" Part II Applications, IEEE, Jul. 1988, pp. 59-75.
Fritsche et al. Automatische Visibilitatsermittlung Von Dreidimensional ErfaBten Maschinenbauteilen, Angewandte Informatid 12/78, pp. 544-547.
C. Wen-tao, "Hidden line Removal Algorithm for Complex Scenes", CH2039-6-84/0000/0446$01.00, IEEE; 1984. pp. 446-450.
Y. Ohno, "A Hidden-Line Elimination Method for Curved Surfaces", Computer Aided Design, vol. 15, No. 4, Jul. 1983, pp. 209-216.
R. Mahl, "Visible Surface Algorithms for Quadric Patches", IEE Transactions on Computers, vol. C-21, No. 1, Jan. 1972, 4 pages.
V. Skala "An Interesting Modification to the Bressenham Algorithm for Hidden-Line Solution", Fundamental Algorithms for Computer Graphics NATO ASI Series vol. F17 1985, 9 pages.
W. R. Franklin et al, "A Simple and Efficient Haloed Line Algorithm for Hidden Line Elimination", Computer Graphics Forum, vol. 6, No. 2, May 1987, pp. 103-109.
M. Wittram, "Hidden-Line Algorithm for Scenes of High Complexity", Computer-Aided Design, vol. 13, No. 4, Jul. 1981, pp. 187-192.
W. R. Franklin, "A Linear Time Exact Hidden Surface Algorithm", ACM 0-89791-021-4/80/0700-0117, 1980, pp. 117-123.
M. Potmesil and M. Freeman, "Implementation of Two Hidden-Line Algorithms", Computers & Graphics, vol. 5, 1979, pp. 31-40.
C. M. Brown, "Fast Display of Well-Tessellated Surfaces", Computer and Graphics, vol. 4, 1979, pp. 77-85.
J. S. Petty et al "Contouring and Hidden-Line Algorithms for Vector Graphic Displays" US Dprtmnt of Commerce Ntnal Technical Infrmtn Service (AD/A-040 530) Jan. 1977, 194 pgs.
I. E. Sutherland et al., "A Characterization of Ten Hidden-Surface Algorithms", Computing Surveys, vol. 6, No. 1, Mar. 1974, 55 pages.
P. Woon "A Computer Procedure for Generating Visible Line Drawings of Solids Bounded by Quadric Surfaces" Thesis submitted to New Your Unvrsty Schl of Engineering 1971 96 pgs.
T. L. Janssen, "A simple Efficient Hidden Line Algorithm", Computers & Structures, vol. 17, No. 4, 1983, pp. 563-571.
Otto Nurmi, "A Fast Line-Sweep Algorithm for Hidden Line Elimination", Unvsty of Karlsruhe, West Germany, BIT 25 (1985), pp. 466-472. , YU, pp. 60-69.
F. Devai, "Expected-Time Analysis of a Worst-Case Optimal Hidden-Surface Algorithm", Computer and Automation Institute, Hungary, pp. 15-24.
Michael McKenna, "Worst-Case Optimal Hidden Surface Removal", The Johns Hopkins University, ACM Transactions on Graphics, vol. 6, No. 1, Jan. 1987, pp. 19.
Chen Lixing, "An Algorithm for Hidden Surface Elimination", Computer Center, South China University of Technology, GuangZhou, China, pp. 70-77.
Robert M. Brown , "Hidden-Line Removal at 20 Pictures/Second through Hybrid Techniques", Summer Computer Simulation Conf., Montreal, Jul. 17-19, 1973, pp. 192-204.
Vesna Mihajiovic Levi, "Hidden Line Algorithm for Convex Penetrating Polyhedral Objects", Int'l Conf. on Computational Graphics & Visualization, 1991, pp. 60-69.
Fritsche et al., Automatische Visibilitatsermittlung von dreidimensional erfaBten Maschinenbauteilen, Angewandte Informatik, vol. 20, Dec. 1978, pp. 544-547.
F. Devai, "Expected-Time Analysis of a Worst-Case Optimal Hidden-Surface Algorithm", Proceedings of the Structural Analysis System World Conference, vol. 4, 1986, pp. 15-24.
Jingzhong, Li et al; "Study of the Hiding Technology about 3D Drawing"; Journal of Liaoning Provincial College of Communications; vol. 3; No. 4; Dec. 2001, 4 pages. (Chinese).
Zhang et al., "Parallel Processing of Z-buffer Algorithm", Journal of Shenyang Architectural and Civil Engineering University, vol. 13, No. 2, downloaded from internet: http://en.cnki.com.cn/Article_en/CJFDTotal-SYJZ702.000.htm, 2 pages.(Chinese).
JP office action dated Jun. 20, 2016, for JP Application No. 2014-533624, 4 pages.
CN office action, dated Jun. 13, 2016, for CN Application No. 201280048164.0, 13 pages.

* cited by examiner

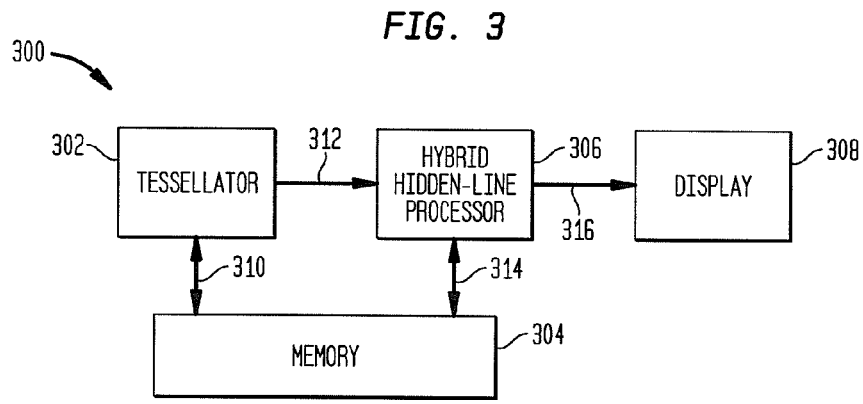
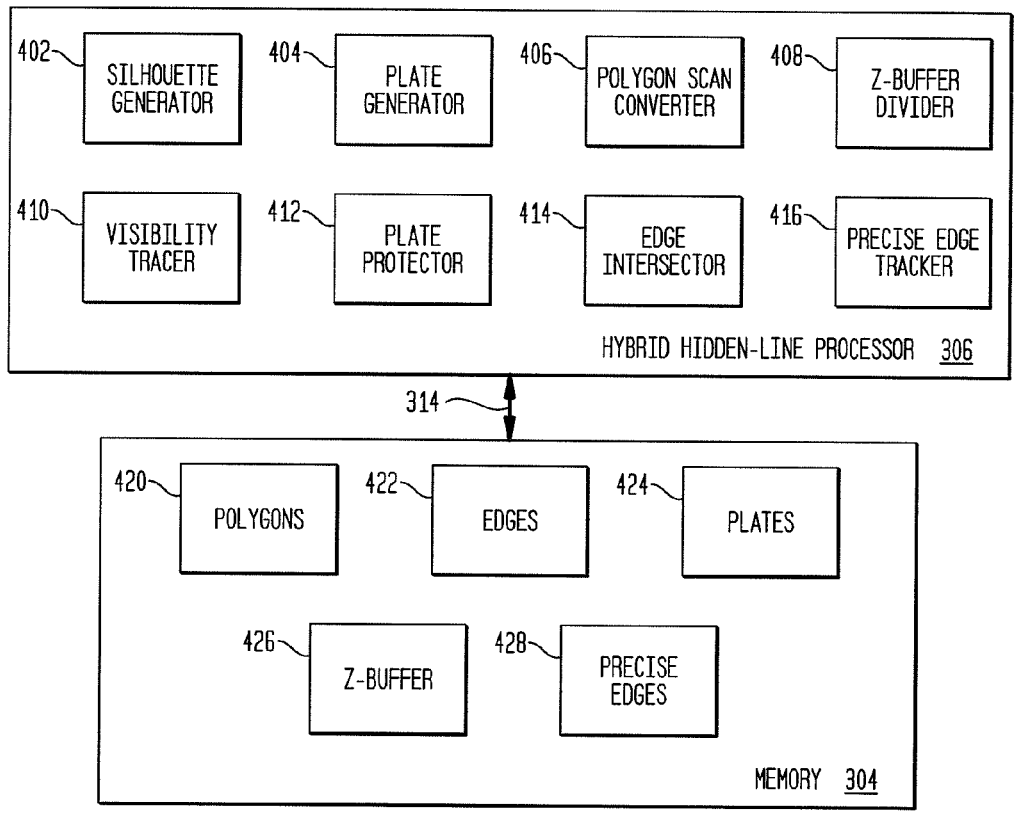

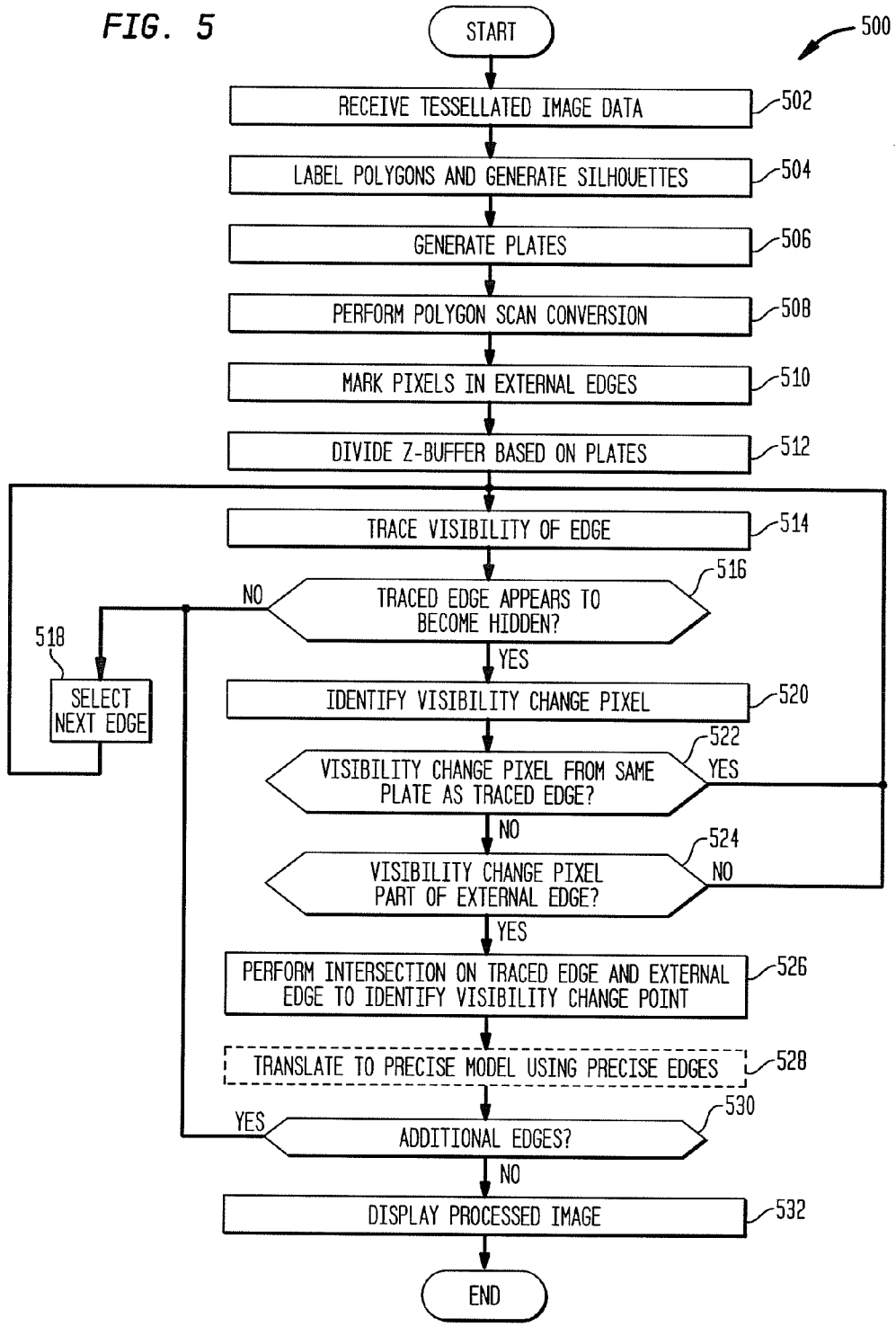

HYBRID HIDDEN-LINE PROCESSOR AND METHOD

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

Conventional computer graphics display systems use various types of processing to generate two-dimensional images of three-dimensional objects.

SUMMARY OF THE DISCLOSURE

Various disclosed embodiments include systems, methods, and computer-readable media. A method for providing hybrid hidden-line processing for a plurality of polygons representing tessellated image data, wherein each polygon comprises a plurality of edges, is disclosed. The method includes generating a back-facing plate comprising polygons on a back-facing side of a silhouette of the tessellated image data and a front-facing plate comprising polygons on a front-facing side of the silhouette of the tessellated image data. The method includes tracing the edges and identifying at least one visibility change pixel in each of a subset of the traced edges. The method includes, for each visibility change pixel, determining whether the traced edge is from the same plate as a polygon corresponding to the visibility change pixel. The method includes, for each traced edge that is determined to be from the same plate as the polygon corresponding to the visibility change pixel, displaying the traced edge.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the concepts and the specific embodiment disclosed as a basis for modifying or designing other systems for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 3 illustrates a portion of the data processing system of FIG. 1 in accordance with the present disclosure;

FIG. 4 illustrates details of the hybrid hidden-line processor and memory of FIG. 3 in accordance with the present disclosure; and FIG. 5 is a flowchart illustrating a method for providing hybrid hidden-line processing in accordance with the present disclosure.

DETAILED DESCRIPTION

Figure 1:
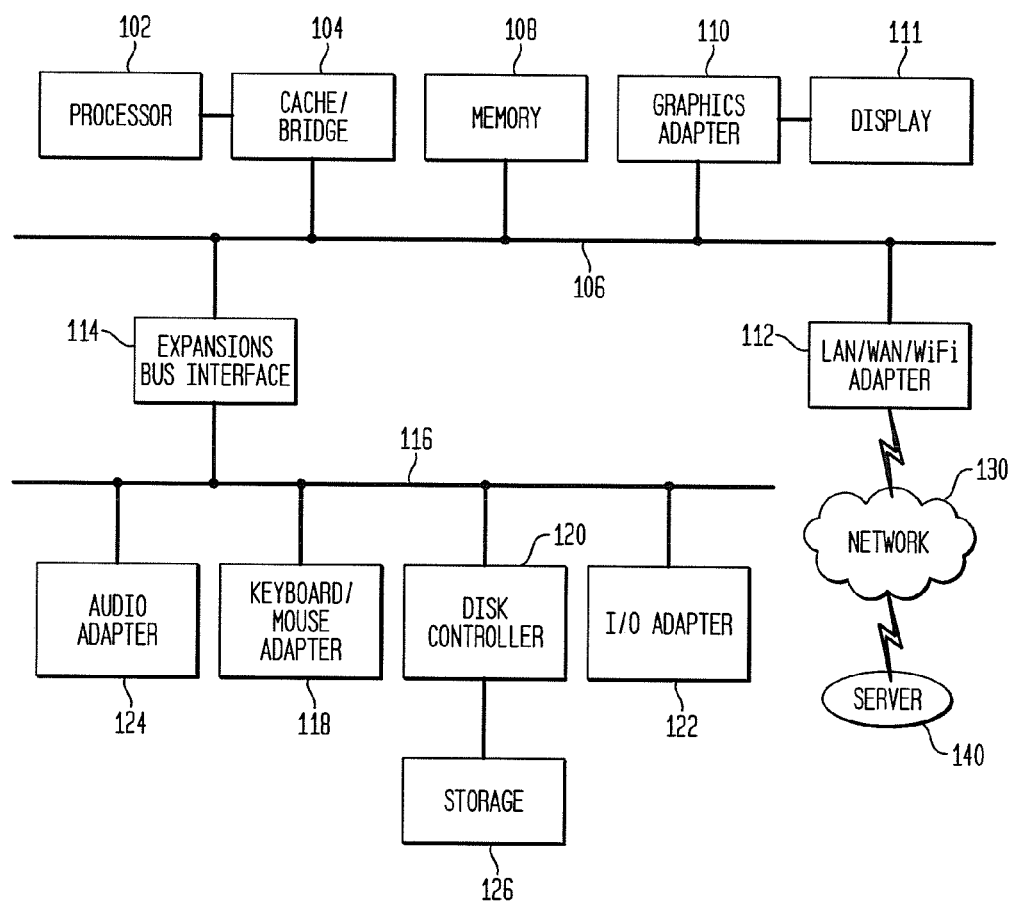
FIG. 1 illustrates a block diagram of a data processing system in which a hybrid hidden-line processor may be implemented in accordance with the present disclosure.

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

A common problem in generating two-dimensional images of three-dimensional objects relates to the identification and removal of hidden lines, (i.e., lines that a user may not want to display because they would appear as hidden due to the viewing angle and/or because they are obscured by another object in the scene). Generally, the methods of identifying hidden lines are either image space algorithms or object space algorithms. However, disadvantages exist with respect to both of these techniques.

Image space processing includes the use of a depth buffer, or Z-Buffer, which divides the screen into pixels and performs visibility processing based on the pixels. If more than one object exists at a pixel location, the data related to the part of the object closest to a viewer would be used in generating the display, thereby hiding arty part of the image that is farther away from the viewer at that pixel. Using image space processing results in relatively quick image generation. However, the accuracy associated with this process is less than what is desired for many applications.

Object space processing, such as those using facetted or precise mathematical representations of the image data, provides greater accuracy as compared to image space processing. However, for users creating drawings of relatively large assemblies (e.g., entire automobiles, ships, etc.), object space techniques may require too much time in displaying the image and too large of a memory footprint. In general, the more accuracy provided by a particular technology, the slower the image generation and the larger the memory footprint associated with the technology.

Thus, for example, a Z-Buffer may define a fixed resolution across the view (e.g., 1000 pixels in X and 1000 pixels in Y). The image to be displayed may be tessellated, which provides a planar approximation of any curved faces of an object by generating a connected mesh of polygons, or facets, representing the object. The polygons and edges are scanned into the Z-Buffer. The "winner" of each of the pixels after the scan corresponds to the hidden-line image. This Z-Buffer algorithm has linear performance as the size of the model increases (i.e., it is an order-n system). Due to its order, this is generally the fastest type of hidden-line processor. In addition, the memory requirement for the polygons is constant as the number of polygons increases, and the memory requirement for the edges is linear as the number of edges increases.

However, the accuracy of a Z-Buffer technique is limited by the number of pixels placed across the view (e.g., 1000 pixels across a large assembly is relatively small). This is manifested by overshoots and undershoots on the resulting image. Also, all coordinates are rounded to an integer in order to map to the Z-Buffer pixels. This rounding can produce degeneracies and associated visibility flaws in Z-Buffer coordinates. In addition, it is difficult to extract an edge from the Z-Buffer, and a polyline or curve output is required for drawing creation and annotation.

A facetted hidden-line processor, which uses an object space technique, generally requires that all of the facetted edge segments be intersected with all other facetted edge segments in the model. This creates a series of edge pieces, each of which has one visibility. Visibility of each of the edge pieces is then determined by topology, ray casting, or other geometric test. Object spaced algorithms attempt to limit the number of intersection candidates and ray fire candidates to the fewest number possible.

The benefits of an object space, facetted hidden-line processor over a precise hidden-line processor include only having to perform intersections between facetted edge segments instead of between precise curves. Line segments are two lines and thus their intersection is relatively fast. Also, the accuracy of the visibility change points is limited by the tessellation tolerance (e.g., 1.0e–03 or 1.0e–04 model units), which results in a much more accurate image as compared to that obtained from a Z-Buffer. Finally, the edges are readily available to place on a drawing (i.e., the edges are the output of the hidden-line processor directly).

However, the order of any object space algorithm is $n^2$. Thus, while each of the intersections of a facetted algorithm is relatively cheap, the order of the algorithm will eventually dominate, making this technique much slower than the Z-Buffer algorithm. In addition, although all techniques attempt to limit the number of intersection candidates, n, the order of the technique remains $n^2$. Furthermore, the edges appear facetted as they are placed on a drawing. Also, the memory requirement for the polygons is linear as the number of polygons increases, and the memory requirement for the edges is linear as the number of edges increases.

A precise hidden-line processor, which also uses an object space technique, generally requires that all of the precise edges be intersected with all other precise edges in the model. This creates a series of edge pieces, each of which has one visibility. Visibility of each of the edge pieces is then determined by topology, by ray casting, or some other geometric test. Precise object space algorithms attempt to limit the number of intersection candidates and ray fire candidates to the fewest number possible.

The benefits of a precise, object space hidden-line processor include providing an accuracy for the visibility change points that is limited by the modeling tolerance (e.g., 1.0e–05 or 1.0e–06 model units), which results in a much more accurate image as compared to that obtained from either a Z-Buffer or object space facetted technique. In addition, the edges and their precise curves are readily available to place on a drawing (i.e., they are the output of the hidden-line processor directly). Finally, because precise curves are used in generating the drawings, the edges appear smooth and exact like in real life.

However, the intersection between two precise edges is an intersection between two general curves, which is relatively slow as compared to intersections between two lines. In addition, the order of a precise object space algorithm is $n^2$. Thus, because each of the intersections is relatively time-consuming and because the order of the algorithm, which will eventually dominate, is $n^2$, a precise algorithm is much slower than the Z-Buffer or facetted algorithms. In addition, although all techniques attempt to limit the number of intersection candidates, n, the order of the technique remains $n^2$. Furthermore, the memory requirement for the surfaces is linear with regard to the number of surfaces, but each surface can be relatively expensive in the amount of required memory. Finally, the memory requirement for the edges is linear as the number of edges increases.

In order to overcome the limitations with conventional hidden-line processing algorithms, a hidden-line processor has recently been developed that intersects line-segment edges in the manner of a facetted algorithm, but with only certain edges being intersected as opposed to all edges being intersected. The edges to be intersected are identified through the use of a Z-Buffer. Thus, accuracy is provided at a level close to that of a facetted algorithm, while speed is provided at a level close to that of a Z-Buffer algorithm. This technique, called a fast hidden-line processor, is based off the facetted model. However, a software Z-Buffer is used to store the polygons. This technique provides linear performance (i.e., order n).

For fast hidden-line processing, the polygon scan conversion includes annotating a pixel if the edge of a polygon is part of an external edge. Winning edge and polygon information are stored in the Z-Buffer. Visibility of the edges is traced through the software Z-Buffer. This process has linear performance (i.e., order n). The Z-Buffer trace identifies any external edge that might hide the edge being traced by looking at the pixel where the current edge goes hidden. This allows the fast hidden-line processor to identify all edge intersections with linear performance instead of $n^2$ performance, as required by conventional, object space facetted hidden-line processors. After the visibility of a pixel is determined, the winning edge in a pixel is used to further refine the visibility change point to tessellated precision (e.g., edge segment, edge segment intersection).

The benefits of the fast hidden-line processor include the identification of edges to be intersected in a linear time (i.e., the time is constant based on the number of edges). This is in contrast with most object space hidden-line processors that require $n^2$ performance to identify all intersections (i.e., intersections of each edge with every other edge). In addition, this technique is a relatively fast-performing technique due to its order and the fact that it uses a software Z-Buffer as its core processor. The memory requirement for the polygons is constant as the number of polygons increases, and the intersections performed are between facetted edge segments, which are intersections between two lines. Furthermore, the locations of visibility change points are detected by the Z-Buffer, and only the intersections where visibility changes are performed. Finally, the accuracy of the visibility change points is limited by the tessellation tolerance (e.g., 1.0e−03 or 1.0e−04 model units), which is much more accurate as compared to results obtained from a Z-Buffer, and the edges are readily available to place on a drawing (i.e., they are the output of the hidden-line processor directly).

However, intersection clean-up with the fast hidden-line processor has limitations relating to edges and silhouettes. Edges often do not win a pixel that they should due to inaccurate Z-depth polygon scan conversion and interiors of polygons winning over exterior edges of polygons. Furthermore, silhouettes generated with this technique are generally inaccurate because they follow the boundaries of polygons in accordance with standard facetted processing techniques.

FIG. 1 illustrates a block diagram of a data processing system 100 in which a hybrid hidden-line processor may be implemented in accordance with the present disclosure. For some embodiments, the data processing system 100 may be implemented as a PDM system particularly configured by software or otherwise to perform the processes as described herein. For a particular embodiment, the data processing system 100 may be implemented as each of a plurality of interconnected and communicating systems as described herein. The data processing system 100 shown in FIG. 1 comprises a processor 102 coupled to a level two cache/bridge 104, which is coupled to a local system bus 106. The local system bus 106 may be, for example, a peripheral component interconnect (PCI) architecture bus. Also coupled to the local system bus in the depicted example are a main memory 108 and a graphics adapter 110. The graphics adapter 110 may be coupled to a display 111.

Other peripherals, such as a local area network (LAN)/wide area network (WAN)/wireless (e.g., Wi-Fi) adapter 112, may also be coupled to the local system bus 106. An expansion bus interface 114 may couple the local system bus 106 to an input/output (I/O) bus 116. The I/O bus 116 may be coupled to a keyboard/mouse adapter 118, a disk controller 120 and an I/O adapter 122. The disk controller 120 may be coupled to a storage 126, which may be any suitable machine-usable or machine-readable storage medium, including but not limited to (i) nonvolatile, hard-coded type media, such as read-only memories (ROMs) or electrically erasable programmable read-only memories (EEPROMs), (ii) magnetic tape storage, and (iii) user-recordable type media, such as floppy disks, hard disk drives, compact disc read-only memories (CD-ROMs) or digital versatile discs (DVDs), and (iv) other known optical, electrical, or magnetic storage devices.

In the illustrated example, the I/O bus 116 may also be coupled to an audio adapter 124, which may be coupled to speakers (not shown in FIG. 1) for playing sounds. The keyboard/mouse adapter 118 may be coupled to a pointing device (not shown in FIG. 1), such as a mouse, trackball, track pointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

The data processing system 100 comprises an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device.

One of various commercial operating systems, such as a version of Microsoft Windows™, a product of Microsoft Corporation located in Redmond, Wash., may be employed if suitably modified. The operating system may be modified or created in accordance with the present disclosure as described.

The LAN/WAN/Wireless adapter 112 may be coupled to a network 130 (not a part of the data processing system 100), which may be any public or private data processing system network or combination of networks, including the Internet. The data processing system 100 may communicate over the network 130 with a server system 140 (also not a part of the data processing system 100). For some embodiments, the server system 140 may be implemented as a separate data processing system.

According to one embodiment of this disclosure, the data processing system 100 may provide hybrid hidden-line processing to generate images to be sent to the display 111. As described in more detail below in connection with FIGS. 3-5, images may be processed by identifying, based on a Z-Buffer technique, a relatively small number of edges to be intersected (such as the intersections performed in a facetted technique). Thus, a speed similar to that of a Z-Buffer algorithm is provided with accuracy similar to that of a facetted algorithm. In addition, for some embodiments, precise edges may be intersected instead of facetted edges, resulting in accuracy similar to precise algorithms with a speed similar to that of a Z-Buffer algorithm.

Using the hybrid hidden-line processing described below, edges win pixels that they should due to accurate polygon scan conversion and due to exterior edges of polygons winning over interiors of polygons. In addition, silhouettes are generated not based on polygon edges but from vertex normals. Thus, a silhouette may cross through the middle of a polygon and is more accurate than those that follow the boundaries of polygons.

Figure 2A:
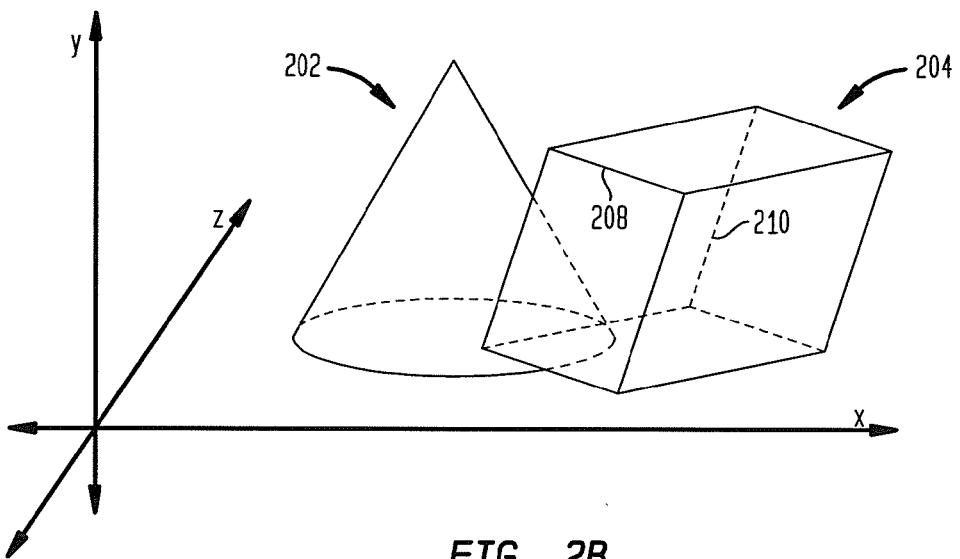
FIGS. 2A-G illustrate examples of various images that may be processed by the data processing system of FIG. 1 in accordance with the present disclosure.

FIGS. 2A-G illustrate examples of various images that may be processed by the data processing system 100 in accordance with the present disclosure. These examples simply illustrate various terms used in the present disclosure. FIG. 2A illustrates a process of displaying three-dimensional images on a two-dimensional display, such as the display 111 of FIG. 1. The two-dimensional display may correspond to the plane defined by the x-axis and the y-axis. The example illustrated includes a cone 202 and a block 204. The solid lines represent lines that may be displayed, while the dashed lines represent hidden lines that may not appear in a two-dimensional display of the cone 202 and the block 204. Thus, as illustrated, the block 204 partially obscures a portion of the cone 202 where the block 204 is in front of the cone 202 from the perspective of a viewer looking directly at the plane defined by the x-axis and the y-axis. One visible line 208 and one hidden line 210 are labeled as examples of these types of lines.

Figure 2B:
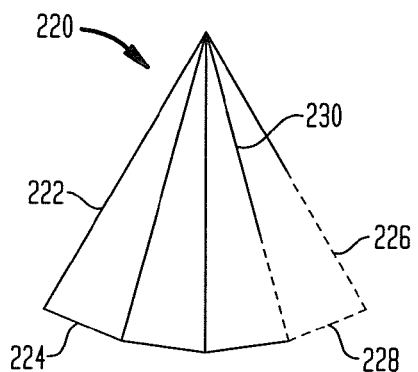

When the three-dimensional image of the cone 202, for example, is processed for display on a two-dimensional screen, the cone 202 may be tessellated to generate a tessellated cone 220, as illustrated in FIG. 2B. Thus, the curved surface of the cone 202 may be approximated by a mesh of polygons, or facets, in order to begin processing the image for display. The tessellated cone 220 shown in FIG. 2B does not include the hidden lines on the back side of the cone 220 for simplicity. However, the lines hidden by the block 204 of FIG. 2A are illustrated in the tessellated cone 220. Also, the block 204 is not shown in tessellated form for simplicity.

In this example, one of the silhouettes 222 of the cone 220 is labeled. This silhouette 222 corresponds to an edge that shares a front-facing polygon and a back-facing polygon. Thus, the silhouette 222 is not a true edge of the object (i.e., the cone 202); however, the silhouette 222 would appear as a visible line to a viewer of the cone 202 from the x-y perspective. As described in more detail below, it will be understood that a true precise silhouette for many images will pass through a polygon, known as a silhouette polygon, instead of lying exactly along the edge between a front-facing polygon and a back-facing polygon.

One of the external edges 224 is also labeled in the example illustrated in FIG. 2B. This edge 224 is a visible edge, as indicated by the solid line. A hidden silhouette segment 226 and a hidden external edge 228 are each shown as a dashed line. An internal edge 230 is also labeled. Although shown as a solid line, it will be understood that internal edges may not be displayed as they correspond to the edges of polygons that make up the tessellated object and, thus, do not correspond to actual or visible edges of the object.

Figure 2C:
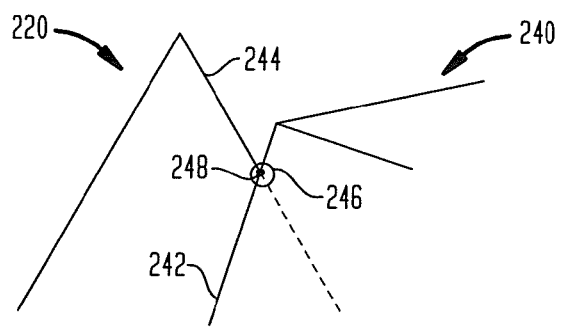

FIG. 2C shows a portion of the tessellated cone 220, along with a portion of a tessellated block 240 that obscures part of the cone 220. For simplicity, the internal edges have been omitted in this illustration. As described in more detail below, during polygon scan conversion, external edges are identified. For example, an external edge 242 of the block 240 is identified. After polygon scan conversion, each external edge is traced through the Z-Buffer in search of visibility change pixels. Thus, for the illustrated example, an edge 244 of the cone 220 may be traced until that edge 244 becomes hidden at the visibility change pixel 246. The hybrid hidden-line processor may then recall the previously identified external edge 242 as existing at the visibility change pixel 246. The hybrid hidden-line processor then performs an intersection on the traced edge 244 and the external edge 242 to identify the visibility change point 248. Thus, as shown in FIG. 2C and described in more detail below, a visibility change pixel 246 comprises a pixel at which an edge may become hidden (plate protection may result in the edge not actually being hidden), and a visibility change point 248 is a point at which the edge does become hidden. The visibility change pixel 246 is less precise than the visibility change point 248; however, it will be understood that the illustrated embodiment shows what may be an exaggerated difference between the resolution of the pixel 246 and the point 248.

Figure 2D:
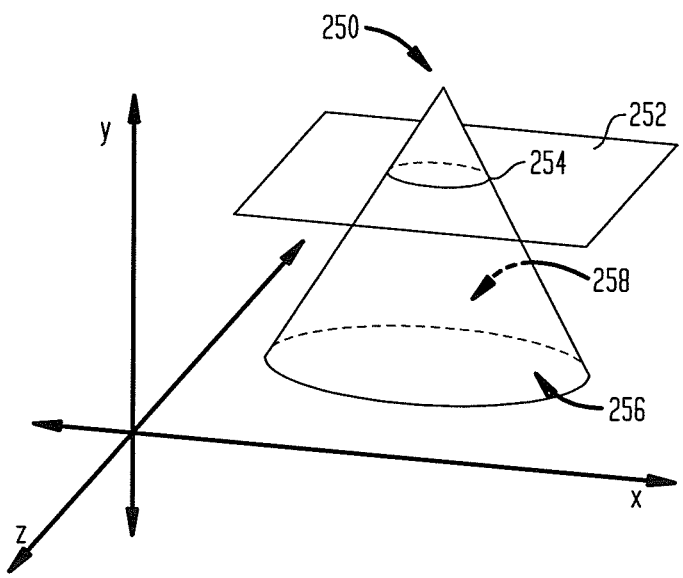
Figure 2E:
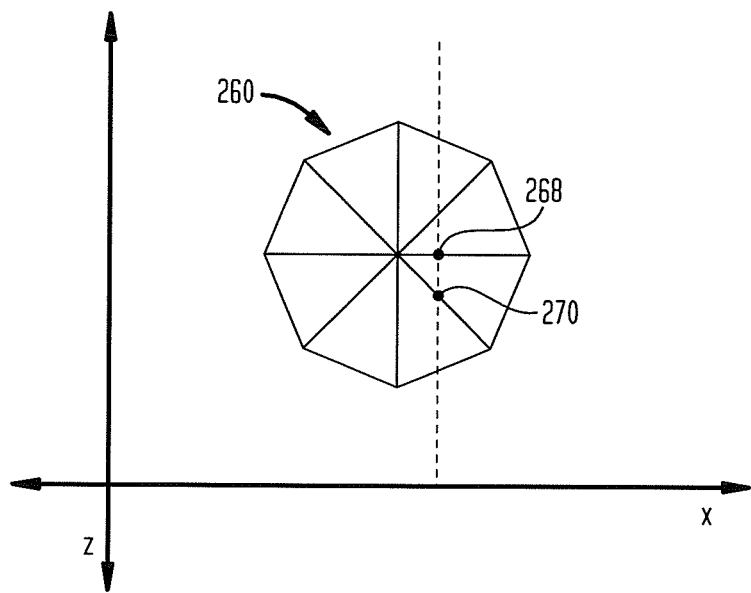

FIG. 2D illustrates a three-dimensional cone 250. A plane 252 is shown intersecting a portion of the cone 250 in order to illustrate a potential problem with currently implemented hidden-line processing techniques. The intersection of the plane 252 with the cone 250 results in a circular cross-section 254 of the cone 250. A front-facing plate 256, which corresponds to pieces of a face that are on the front side of the silhouette, and a back-facing plate 258, which corresponds to pieces of a face that are on the back side of the silhouette, may be used as described below to provide plate protection. FIG. 2E shows a tessellated cross-section 260 that represents the circular cross-section 254 of FIG. 2D approximated by a polygonal tessellation.

A technique to improve the accuracy of the Z-Buffer trace in the hybrid hidden-line processor is illustrated in FIG. 2E. In this example, a point 268 on an external edge of one polygon has the same x and y Z-Buffer coordinates as a point 270 on an internal edge of a neighboring polygon. Thus, using standard processing, the point 270 would win the pixel as compared to the point 268 because the point 270 has a greater z-value than the point 268. However, since the point 268 is on an external edge, that point 268 should win the pixel. Therefore, as described in more detail below, the hybrid hidden-line processor provides plate protection to ensure that the external edge point 268 is displayed over the internal edge point 270.

Figure 2F:
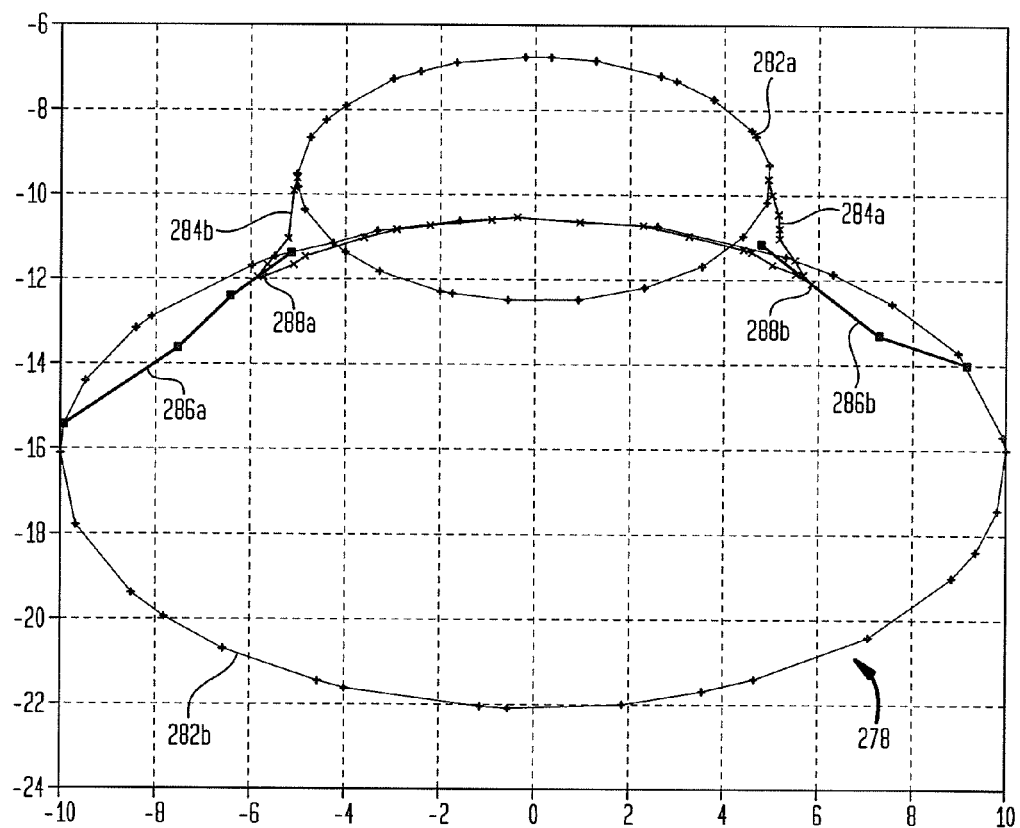
Figure 2G:
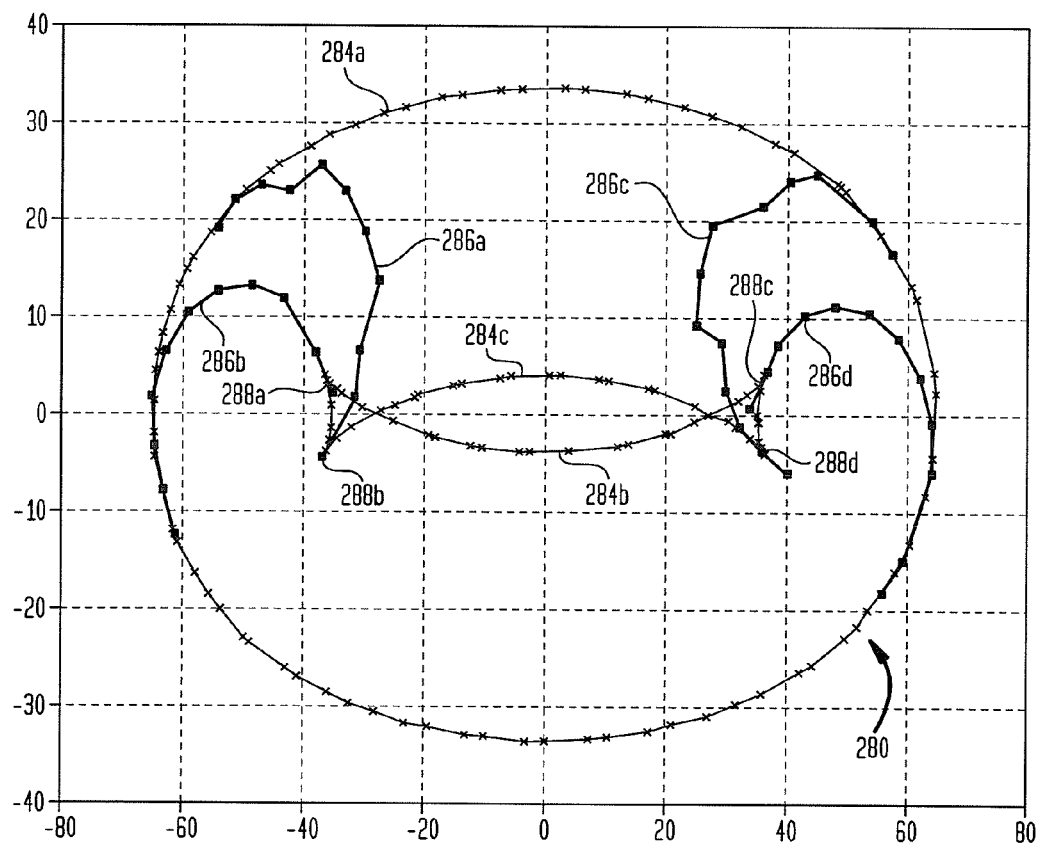

FIGS. 2F and 2G illustrate how additional plate protection may also be provided for doubly-curved surfaces, such as surfaces 278 and 280. For the illustrated examples, the surface 278 has external edges 282 and both surfaces 278 and 280 have silhouettes 284 and plate-break lines 286. For doubly-curved surfaces, silhouettes 284 may not completely define the boundaries between front-facing plates and back-facing plates. Thus, silhouette cusp points 288 may be identified for these surfaces 278 and 280 and used to generate additional plate-break lines 286 that further define the boundaries between plates.

FIG. 3 illustrates a portion 300 of the data processing system 100 in accordance with the present disclosure. It will be understood that the data processing system 100 is an example of one type of system in which the components illustrated in FIG. 3 may be implemented, and that these components may be implemented in any other suitably arranged image-generating system without departing from the scope of the present disclosure.

For the illustrated embodiment, the portion 300 comprises a tessellator 302, a memory 304, a hybrid hidden-line processor 306 and a display 308. For some embodiments, the tessellator 302 and/or the hybrid hidden-line processor 306 may be implemented using a general-purpose processor, such as the processor 102 of FIG. 1. The tessellator 302, which may be coupled to the memory 304, is capable of receiving image data that represents three-dimensional objects for display. For some embodiments, the tessellator 302 may be capable of retrieving the image data from the memory 304 via path 310. For other embodiments, the tessellator 302 may receive the image data from another component (not shown in FIG. 3) of the data processing system 100.

The tessellator 302 is capable of tessellating the precise image data to generate tessellated image data. The tessellated image data comprises data capable of identifying a plurality of polygons, or facets that make up the tessellated version of the object to be displayed. For example, for some embodiments, the tessellated image data may comprise coordinates for each of the vertices of a plurality of triangles or other polygons making up the tessellated image.

For some embodiments, the tessellator 302 is capable of providing the tessellated image data to the hybrid hidden-line processor 306 via path 312. However, for other embodiments, the tessellator 302 may be capable of storing the tessellated image data in the memory 304 via the path 310 and providing a ready signal via the path 312 alerting the hybrid hidden-line processor 306 of the presence of the tessellated image data in the memory 304.

The hybrid hidden-line processor 306, which is coupled to the tessellator 302 and the memory 304, is capable of receiving the tessellated image data or the ready signal from the tessellator 302. For embodiments in which the tessellated image data is stored in the memory 304, the hybrid hidden-line processor 306 is capable of retrieving the tessellated image data from the memory 304 based on the ready signal. However, it will be understood that, as used herein, "receiving" the tessellated image data comprises passively receiving the data, as well as actively retrieving the data.

After receiving the tessellated image data, the hybrid hidden-line processor 306 is capable of identifying the edges of the polygons represented by the tessellated image data and selecting a subset of the edges for performing intersections based on a Z-Buffer algorithm. As described in more detail below in connection with FIGS. 4 and 5, the hybrid hidden-line processor 306 is capable of identifying visibility change pixels along the edges of the polygons and intersecting those edges with any external edges also at the visibility change pixels in order to determine visibility change points on the external edge. The hybrid hidden-line processor 306 is also capable of generating accurate silhouettes based on vertex normals, performing accurate Z-depth polygon scan conversion with regard to the Z-Buffer, and providing plate protection for external edges and silhouettes. In performing this hidden-line processing, the hybrid hidden-line processor 306 is capable of generating display data based on the tessellated image data relatively quickly and relatively accurately.

The display 308, which is coupled to the hybrid hidden-line processor 306, is capable of receiving the display data from the hybrid hidden-line processor 306 via path 316 and displaying a processed image based on the display data for a user of the data processing system 100. In another embodiment, the hybrid-hidden-line processor could send the image data out to a plotter to create hard copy paper drawings.

FIG. 4 illustrates details of the hybrid hidden-line processor 306 and the memory 304 in accordance with the present disclosure. For some embodiments, the hybrid hidden-line processor 306 may be implemented using a general-purpose processor, such as the processor 102 of FIG. 1. For the illustrated embodiment, the hybrid hidden-line processor 306 comprises a silhouette generator 402, a plate generator 404, a polygon scan converter 406, a Z-Buffer divider 408, a visibility tracer 410, a plate protector 412, an edge intersector 414 and an optional precise edge tracker 416. In addition, the memory 304 comprises polygons 420, edges 422, plates 424, a Z-Buffer 426 and optional precise edges 428.

Although illustrated and described as separate components for simplicity, it will be understood that any two or more of the components 402, 404, 406, 408, 410, 412, 414 and 416 of the hybrid hidden-line processor 306 may be implemented together as a single component without departing from the scope of the present disclosure. Also, any one of the components 402, 404, 406, 408, 410, 412, 414 and 416 may be implemented as two or more components in some embodiments. In addition, the following description assumes the polygons represented in the tessellated image data are triangles. However, it will be understood that the tessellated image data may represent other types of polygons without departing from the scope of the present disclosure.

The silhouette generator 402 is capable of accurately generating silhouettes based on vertex normals of the vertices of the polygons 420 represented by the tessellated image data. Silhouette points occur where the dot product of a polygon normal and the eye vector is zero. If a point is on a back-facing polygon, the dot product is negative, while if a point is on a front-facing polygon, the dot product is positive. Thus, the silhouette generator 402 is capable of performing a silhouette function, i.e., the dot product of the normal and the eye vector, at each of the polygon's three vertices for each of the polygons 420 in order to generate silhouettes.

Based on the silhouette functions, the silhouette generator 402 is capable of determining whether the polygon is front-facing or back-facing. If the silhouette generator 402 determines that the silhouette function for each of the three triangle vertices is negative, the silhouette generator 402 identifies the polygon as a back-facing polygon. Thus, no silhouettes exist for this polygon. The silhouette generator 402 is also capable of labeling the polygon as back-facing in the polygons 420 portion of the memory 304.

Similarly, if the silhouette generator 402 determines that the silhouette function for each of the three triangle vertices is positive, the silhouette generator 402 identifies the polygon as a front-facing polygon. Thus, no silhouettes exist for this polygon. The silhouette generator 402 is also capable of labeling the polygon as front-facing in the polygons 420 portion of the memory 304.

However, if the silhouette generator 402 determines that the silhouette functions for a triangle are mixed, i.e., at least one silhouette function for one of the three triangle vertices is negative and at least one silhouette function for one of the three triangle vertices is positive, the silhouette generator 402 identifies the polygon as a silhouette polygon. In this situation, the silhouette generator 402 is capable of performing a linear interpolation along each polygon edge to identify true silhouette points. However, because the silhouette functions for two of the vertices will have the same sign, no silhouette point exists on the edge connecting those two vertices. Therefore, the silhouette generator 402 may perform the linear interpolation along the other two edges of the triangle. This process identifies two silhouette points in the triangle. The silhouette generator 402 is then capable of forming a silhouette segment by connecting the two silhouette points. Once the silhouette generator 402 is finished forming silhouette segments, the silhouette generator 402 is capable of coupling the silhouette segments formed from different triangles together to generate a silhouette edge and storing the silhouette edge in the edges 422 portion of the memory 304.

For some embodiments, the silhouette generator 402 is capable of generating precise silhouette edges. For example, for certain types of faces, the precise type of the silhouette is known (e.g., silhouettes of spheres are circles). For these types of faces, the silhouette generator 402 may be capable of fitting a precise curve of the correct type to the tessellated silhouette. For other surface types, the silhouette generator 402 may be capable of fitting a cubic B-spline through the tessellated silhouette points to generate a precise silhouette curve.

For doubly-curved surfaces, such as the surfaces 278 and 280 of FIGS. 2F and 2G, the silhouette generator 402 may also be capable of identifying any silhouette cusp points for the surfaces and generating plate-break lines based on the silhouette cusp points.

The plate generator 404 is capable of generating the front-facing plates and the back-facing plates, such as the front-facing plate 256 and the back-facing plate 258 illustrated in FIG. 2D. For some embodiments, the plate generator 404 is capable of generating a front-facing plate based on the identification by the silhouette generator 402 in the polygons 420 portion of the memory 304 of front-facing polygons and generating a back-facing plate based on the identification by the silhouette generator 402 in the polygons 420 portion of the memory 304 of back-facing polygons. Thus, for some embodiments, the plate generator 404 is capable of generating a front-facing plate by adding each front-facing polygon to the front-facing plate stored in the plates 424 portion of the memory 304 and generating a back-facing plate by adding each back-facing polygon to the back-facing plate stored in the plates 424 portion of the memory 304. For other embodiments, the plate generator 404 is capable of generating a front-facing plate by adding each front-facing polygon to a plate stored in the plates 424 portion of the memory 304 and generating a back-facing plate by not adding each back-facing polygon to the plate stored in the plates 424. Thus, for these embodiments, the absence of a polygon from the plates 424 portion of the memory 304 indicates that the polygon is from the back-facing plate. For doubly-curved surfaces, such as the surfaces 278 and 280 of FIGS. 2F and 2G, the plate generator 404 may also be capable of generating the plates based on the plate-break lines generated by the silhouette generator 402.

The polygon scan converter 406 is capable of scan converting the polygons represented by the tessellated image data, or polygons 420, into the Z-Buffer 426. For some embodiments, the polygon scan converter 406 is capable of providing barycentric scan conversion in order to produce a continuous function in the Z-Buffer visibility map. During scan conversion, the polygon scan converter 406 is also capable of identifying external edges of the polygons 420 being scan converted. For some embodiments, the polygon scan converter 406 is capable of storing the external edge identifications in the Z-Buffer 426 by marking pixels that are part of external edges or silhouette edges as belonging to external edges.

The Z-Buffer divider 408 is capable of storing the division of the polygons 420 into plates 424 in the Z-Buffer 426. Thus, the Z-Buffer divider 408 is capable of dividing the Z-Buffer 426 into separate regions, or plates, which correspond to pieces of a face that are on the same side of the silhouette, based on the plates 424 generated by the plate generator 404.

The visibility tracer 410 is capable of tracing each edge through the Z-Buffer 426 and identifying a visibility change pixel, such as the visibility change pixel 246 illustrated in FIG. 2C, if the traced edge appears to become hidden. For some embodiments, the visibility tracer 410 may determine where a traced edge appears to become hidden by stepping the edge through the Z-Buffer 426. During the stepping process, the visibility tracer 410 identifies the pixel where the traced edge appears to become hidden as a visibility change pixel.

The plate protector 412 is then capable of performing plate protection. For some embodiments, the plate protector 412 may perform plate protection by determining whether the traced edge is behind a pixel from the same plate. If the plate protector 412 determines that the traced edge is behind a pixel from the same plate, the traced edge is not hidden. Thus, if an edge and a polygon are from the same plate, the polygon does not hide the edge regardless of the Z-values.

If the edge is actually hidden, i.e., the plate protector 412 has not determined that the edge should be visible based on plate protection, the edge intersector 414 is capable of checking the Z-Buffer 426 portion of the memory 304 to determine whether the visibility change pixel contains an external edge as previously marked during the polygon scan conversion. If the visibility change pixel does contain an external edge, the edge intersector 414 is capable of extracting the external edge from the edges portion of memory 422 and performing an edge intersection of the edge being traced by the visibility tracer 410 and the external edge identified as corresponding to the visibility change pixel. For some embodiments, the edge intersector 414 is capable of intersecting precise edges. For example, the edge intersector 414 may be capable of intersecting a non-uniform rational basis spline (NURBS) curve with a NURBS curve instead of simply a line segment with a line segment.

For embodiments in which the hybrid hidden-line processor 306 comprises a precise edge tracker 416, the precise edge tracker 416 is capable of substituting precise edge information, which is stored in the precise edges 428 portion of the memory 304, for facetted edge information. Thus, the precise edge tracker 416 is capable of substituting a precise edge for each facetted edge of each polygon in order to provide more accurate display data. The hybrid hidden-line processor 306 is capable of generating the display data for the display 308 based on the processing described above.

For some embodiments, a conversion from facetted to precise images may be more directly implemented, as opposed to simply substituting precise edges 428 for facetted edges. For these embodiments, the precise edge tracker 416 may be capable of converting facetted silhouettes to precise silhouettes based on a projection of the facetted silhouettes to the precise surface. To accomplish this, the end points of the facetted silhouette may be projected onto their associated precise edges 428. The interior points of the facetted silhouette may be projected onto the underlying precise surface.

In addition, the precise edge tracker 416 may be capable of fitting a precise curve to the projected points according to the underlying surface type. For example, for planes, no silhouettes exist. For cylinders and cones, no interior points are used along the silhouette. Instead, the two end points of the silhouette that have been projected onto the precise edge are used and a line is generated between these two end points. For spheres, a circular arc is generated through the projected tessellated silhouette points. For other surface types, a cubic B-spline curve may be generated through the projected tessellated silhouette points. During each type of curve fitting, the end points of the curve are maintained on the precise edges to which they are attached.

Also for these embodiments, visibility change points may be converted from facetted to precise. For some of these embodiments, this conversion uses a Newton Raphson stepping algorithm to find the location of the visibility change point on the two precise curves. For the first visibility change point, it is explicitly moved to the beginning of the precise edge. For each interior visibility change point, the current visibility change point is projected onto the current edge to obtain a starting refinement value. The mate visibility change point is projected onto the mate edge in projected coordinate space to obtain a t-value. A Newton Raphson stepping function is executed to refine the visibility change point in 2D. This refined visibility change point is used as the visibility change point. The list of visibility change points is buffered up along the edge.

FIG. 5 is a flowchart illustrating a method 500 for providing hybrid hidden-line processing in accordance with the present disclosure that may be performed by one or more PDM data processing systems as disclosed herein. The method 500 begins with the hybrid hidden-line processor 306 receiving tessellated image data (step 502). For some embodiments, the hybrid hidden-line processor receives the tessellated image data from the tessellator 302. For other embodiments, the hybrid hidden-line processor 306 retrieves the tessellated image data from the memory 304. For example, the hybrid hidden-line processor 306 may retrieve the tessellated image data from the polygons 420 portion of the memory 304. The following description assumes the polygons 420 are triangles. However, it will be understood that the tessellated image data may represent other types of polygons without departing from the scope of the present disclosure.

The silhouette generator 402 labels the polygons 420 while generating silhouettes based on vertex normals of the vertices of the polygons 420 (step 504). For example, the silhouette generator 402 may perform a silhouette function, i.e., a dot product of the normal and the eye vector, at each of the polygon's three vertices for each of the polygons 420. If the silhouette function is negative for each of the three triangle vertices, the silhouette generator 402 identifies the polygon as a back-facing polygon and labels the polygon as such in the polygons 420 portion of the memory 304. If the silhouette function is positive for each of the three triangle vertices, the silhouette generator 402 identifies the polygon as a front-facing polygon and labels the polygon as such in the polygons 420 portion of the memory 304. For both back-facing and front-facing polygons, no silhouettes exist.

However, if the silhouette generator 402 determines that the silhouette functions for a triangle are mixed, the silhouette generator 402 performs a linear interpolation along each polygon edge to identify two, true silhouette points and forms a silhouette segment by connecting the two silhouette points. Because the silhouette functions for two of the vertices will have the same sign, no silhouette point exists on the edge connecting those two vertices. Thus, the silhouette generator 402 may perform the linear interpolation along the other two edges to identify the true silhouette points. The silhouette generator 402 then couples the silhouette segments together to generate a silhouette edge and stores the silhouette edge in the edges 422 portion of the memory 304.

For some embodiments, the silhouette generator 402 generates precise silhouette edges by fitting a precise curve of the correct type to the tessellated silhouette for known types of faces and fitting a cubic B-spline through the tessellated silhouette points for unknown types of faces. For doubly-curved surfaces, such as the surfaces 278 and 280 of FIGS. 2F and 2G, the silhouette generator 402 may identify any silhouette cusp points for the surfaces and generate plate-break lines based on the silhouette cusp points.

The plate generator 404 generates plates, which comprise pieces of a face that are on the same side of the silhouette (step 506). For some embodiments, the plate generator 404 is capable of generates a front-facing plate by adding each front-facing polygon 420 labeled by the silhouette generator 402 to the front-facing plate and generates a back-facing plate by adding each back-facing polygon 420 labeled by the silhouette generator 402 to the back-facing plate. For doubly-curved surfaces, such as the surfaces 278 and 280 of FIGS. 2F and 2G, the plate generator 404 may generate the plates based on the plate-break lines generated by the silhouette generator 402.

The polygon scan converter 406 scan converts the polygons represented by the tessellated image data, or polygons 420, into the Z-Buffer 426 (step 508). For some embodiments, the polygon scan converter 406 performs barycentric scan conversion to produce a continuous function in the Z-Buffer visibility map. During scan conversion, the polygon scan converter 406 identifies external edges and silhouette edges of the polygons 420 and marks pixels that are part of these edges as belonging to external edges in the Z-Buffer 426 portion of the memory 304 (step 510).

The Z-Buffer divider 408 divides the Z-Buffer 426 into separate regions, or plates, based on the plates 424 generated by the plate generator 404 (step 512). The visibility tracer 410 begins to trace the visibility of an edge through the Z-Buffer 426 (step 514). If the visibility tracer 410 completes the trace of the edge without the traced edge appearing to become hidden (step 516), the visibility tracer 410 selects the next edge to be traced (step 518) and begins a new visibility trace (step 514).

However, if the visibility tracer 410 determines that the traced edge appears to have become hidden (step 516), the visibility tracer 410 identifies the visibility change pixel, i.e., the pixel at which the traced edge appears to become hidden (step 520). The plate protector 412 performs plate protection to ensure that silhouettes and edges are preferred over polygons by verifying whether or not the traced edge is actually hidden. The plate protector 412 makes this verification by determining whether the traced edge is behind a pixel from the same plate (i.e., the traced edge and the visibility change pixel are both from the front-facing plate or both from the back-facing plate) (step 522).

If the plate protector 412 determines that the traced edge is behind a pixel from the same plate (step 522), the plate protector 412 determines that the traced edge is not actually hidden and should be displayed. Thus, if an edge and a polygon are from the same plate, the polygon does not hide the edge. The visibility tracer 410 then continues to trace the edge without hiding the edge behind the previously identified visibility change pixel (step 514). However, if the plate protector 412 determines that the traced edge is behind a pixel from a different plate (step 522), the edge intersector 414 makes a determination as to whether or not the visibility change pixel is part of an external edge (step 524). If the edge intersector 414 determines that the visibility change pixel is not part of an external edge, as marked by the polygon scan converter 406 in step 510 (step 524), the visibility tracer 410 simply marks the edge as hidden at the pixel location and then continues to trace the edge (step 514).

However, if the edge intersector 414 determines that the visibility change pixel is part of an external edge, as marked by the polygon scan converter 406 in step 510 (step 524), the edge intersector 414 performs an intersection on the traced edge and the external edge of which the visibility change pixel is a part to identify the visibility change point (step 526). For some embodiments, the edge intersector 414 is capable of intersecting facetted edges, i.e., line segments. For other embodiments, the edge intersector 414 is capable of intersecting precise edges, e.g., NURBS curves.

For embodiments in which the hybrid hidden-line processor 306 comprises a precise edge tracker 416, the precise edge tracker 416 may substitute precise edge information, which is stored in the precise edges 428 portion of the memory 304, for facetted edge information, if desired (optional step 528).

If additional edges remain to be traced (step 530), the next edge is selected (step 518) and the visibility tracer 410 begins to trace the next edge (step 514). However, when no edges remain to be traced (step 530), the hybrid hidden-line processor 306 generates display data for the display 308 based on the above-described processing techniques, and the display 308 displays a processed image based on the display data (step 532). It will be understood that the hybrid hidden-line processor 306 may generate the display data for the display 308 while the edges are being traced instead of waiting until all the edges have been traced to generate the display data.

In this way, a more accurate and faster hidden-line processing technique is provided. For example, the implementation of plate protection ensures that edges, including silhouette edges, are not hidden by the interiors of polygons. Edges that are not hidden may be used to perform secondary error clean ups. Accurate silhouettes are generated from the vertex normals and may actually cross through the middle of polygons, as opposed to inaccurate silhouettes that are based on polygon edges. In addition, more accurate polygon scan conversion is provided when barycentric scan conversion is implemented, as opposed to Z-Buffer stepping. Finally, for embodiments that provide for precise refinement, precise silhouettes may be generated from facetted silhouettes and known precise surface types, and line segment intersections may be replaced with precise edge intersections to provide even more accurate results.

Those of skill in the art will recognize that, unless specifically indicated or required by the sequence of operations, certain steps in the processes described above may be omitted, combined, performed concurrently or sequentially, or performed in a different order. Processes and elements of different exemplary embodiments above can be combined within the scope of this disclosure.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of the data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable media include: nonvolatile, hard-coded type media such as read-only memories (ROMs) or electrically erasable programmable read-only memories (EEPROMs), and user-recordable type media such as floppy disks, hard disk drives and compact disc read-only memories (CD-ROMs) or digital versatile discs (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method performed by a product data management (PDM) data processing system for providing hybrid hidden-line processing for a plurality of polygons representing tessellated image data, each polygon comprising a plurality of edges, the method comprising:

generating silhouettes for each of the plurality of polygons by performing a silhouette function using vertex normal at every vertex of each respective polygon;

generating a back-facing plate comprising polygons on a back-facing side of a silhouette of the tessellated image data and a front-facing plate comprising polygons on a front-facing side of the silhouette of the tessellated image data;

tracing the edges;

identifying at least one visibility change pixel in each of a subset of the traced edges as a function of locating an intersection between the traced edges;

for each visibility change pixel, determining whether the traced edges are from a same plate as a polygon corresponding to the visibility change pixel; and for each traced edge that is determined to be from the same plate as the polygon corresponding to the visibility change pixel, displaying the traced edge.

2. The method of claim 1, wherein each of at least a subset of the edges comprises one of an external edge and an internal edge, further comprising:

for each of a subset of the traced edges that is determined to be from a different plate as compared to the polygon corresponding to the visibility change pixel, identifying an external edge corresponding to the visibility change pixel; and for each identified external edge, intersecting the traced edge with the external edge to identify a visibility change point.

3. The method of claim 2, wherein intersecting the traced edge with the external edge comprises intersecting a first line segment with a second line segment.

4. The method of claim 2, wherein intersecting the traced edge with the external edge comprises intersecting a first curve with a second curve.

5. The method of claim 1, wherein the polygons comprise triangles, and wherein generating the silhouettes comprises, for each polygon:

performing a silhouette function at each of the polygon's vertices;

if the silhouette function for each of the three triangle vertices is negative, identifying the polygon as a back-facing polygon and determining that no silhouette exists for the polygon;

if the silhouette function for each of the three triangle vertices is positive, identifying the polygon as a front-facing polygon and determining that no silhouette exists for the polygon; and if at least one silhouette function for the polygon is negative and at least one silhouette function for the polygon is positive, identifying the polygon as a silhouette polygon, performing a linear interpolation along edges of the silhouette polygon to identify two silhouette points, and forming a silhouette segment by connecting the two silhouette points.

6. The method of claim 5, wherein performing the linear interpolation comprises performing the linear interpolation along a first edge of the silhouette polygon and a second edge of the silhouette polygon, and wherein the third edge of the silhouette polygon is bounded by the two vertices for which the silhouette functions have a same sign.

7. The method of claim 5, wherein generating the silhouettes further comprises coupling together the silhouette segments for each of the silhouette polygons to generate a silhouette edge.

8. The method of claim 7, wherein generating the silhouettes further comprises refining the silhouette edge by at least one of (i) fitting a precise curve to the silhouette edge for a known type of face and (ii) fitting a cubic B-spline through the silhouette points for each silhouette segment for an unknown type of face.

9. A data processing system comprising:
  a memory configured to store polygons representing tessellated image data, external edges of the polygons, and a front-facing plate comprising polygons on a front-facing side of a silhouette of the tessellated image data;
  a hybrid hidden-line processor coupled to the memory, wherein the processor is configured to generate display data based on the tessellated image data by generating silhouettes by performing a silhouette function using the vertex normal at every vertex of each respective polygon and providing plate protection for the external edges and the silhouettes;
  a visibility tracer configured to trace the edges and identify at least one visibility change pixel in each of a subset of traced edges as a function of locating an intersection between the traced edges; and
  a display coupled to the processor, wherein the display is configured to display a processed image based on the display data.

10. The data processing system of claim 9, wherein the processor comprises:
  a plate generator configured to generate the front-facing plate and to generate a back-facing plate comprising polygons on a back-facing side of the silhouette; and
  a plate protector configured to provide the plate protection by, for each visibility change pixel, determining whether the traced edge is from the same plate as a polygon corresponding to the visibility change pixel, and for each traced edge that is determined to be from the same plate as the polygon corresponding to the visibility change pixel, causing the traced edge to be displayed.

11. The data processing system of claim 10, wherein the processor further comprises an edge intersector that is configured to (i) for each of a subset of the traced edges that is determined to be from a different plate as compared to the polygon corresponding to the visibility change pixel, identify an external edge corresponding to the visibility change pixel, and (ii) for each identified external edge, intersect the traced edge with the external edge to identify a visibility change point.

12. The data processing system of claim 10, wherein the polygons comprise triangles, and wherein the processor further comprises a silhouette generator configured to generate the silhouettes by, for each polygon:
  performing a silhouette function at each of the polygon's vertices;
  if the silhouette function for each of the three triangle vertices is negative, identifying the polygon as a back-facing polygon and determining that no silhouette exists for the polygon;
  if the silhouette function for each of the three triangle vertices is positive, identifying the polygon as a front-facing polygon and determining that no silhouette exists for the polygon; and
  if at least one silhouette function for the polygon is negative and at least one silhouette function for the polygon is positive, identifying the polygon as a silhouette polygon, performing a linear interpolation along edges of the silhouette polygon to identify two silhouette points, and forming a silhouette segment by connecting the two silhouette points.

13. The data processing system of claim 12, wherein the silhouette generator is further configured to identify a first edge of the silhouette polygon that is bounded by the two vertices for which the silhouette functions have a same sign and to perform the linear interpolation along a second edge of the silhouette polygon and a third edge of the silhouette polygon.

14. The data processing system of claim 12, wherein the memory is further configured to store a Z-Buffer, and wherein the processor further comprises a polygon scan converter configured to provide barycentric scan conversion of the polygons into the Z-Buffer.

15. The data processing system of claim 14, wherein the processor further comprises a Z-Buffer divider configured to divide the polygons in the Z-Buffer into plates based on the front-facing plate and the back-facing plate generated by the plate generator.

16. A non-transitory computer-readable medium encoded with executable instructions that, when executed, cause one or more data processing systems to:
  generate silhouettes for each of the plurality of polygons by performing a silhouette function using vertex normal at every vertex of each respective polygon;
  generate a back-facing plate comprising polygons on a back-facing side of a silhouette and a front-facing plate comprising polygons on a front-facing side of the silhouette, each polygon comprising a plurality of edges;
  trace the edges;
  identify at least one visibility change pixel in each of a subset of the traced edges, as a function of locating an intersection between the traced edges;
  for each visibility change pixel, determine whether the traced edges are from a same plate as a polygon corresponding to the visibility change pixel; and
  for each traced edge that is determined to be from the same plate as the polygon corresponding to the visibility change pixel, generate the traced edge for display.

17. The computer-readable medium of claim 16, wherein each of at least a subset of the edges comprises one of an external edge and an internal edge, and wherein the computer-readable medium is further encoded with executable instructions that, when executed, cause one or more data processing systems to:
  for each of a subset of the traced edges that is determined to be from a different plate as compared to the polygon corresponding to the visibility change pixel, identify an external edge corresponding to the visibility change pixel; and
  for each identified external edge, intersect the traced edge with the external edge to identify a visibility change point.

18. The computer-readable medium of claim 16, wherein the polygons comprise triangles, and wherein the computer-readable medium is further encoded with executable instructions that, when executed, cause one or more data processing systems to:
  for each polygon,
    perform a silhouette function at each of the polygon's vertices,
    if the silhouette function for each of the three triangle vertices is negative, identify the polygon as a back-facing polygon and determine that no silhouette exists for the polygon,
    if the silhouette function for each of the three triangle vertices is positive, identify the polygon as a front-facing polygon and determine that no silhouette exists for the polygon, and if at least one silhouette function for the polygon is negative and at least one silhouette function for the polygon is positive, identify the polygon as a silhouette polygon, perform a linear interpolation along edges of the silhouette polygon to identify two silhouette points and form a silhouette segment by connecting the two silhouette points; and couple together the silhouette segments for each of the silhouette polygons to generate a silhouette edge.

19. The computer-readable medium of claim 18, wherein the polygons comprise triangles, and wherein the computer-readable medium is further encoded with executable instructions that, when executed, cause one or more data processing systems to refine the silhouette edge by at least one of (i) fitting a precise curve to the silhouette edge for a known type of face and (ii) fitting a cubic B-spline through the silhouette points for each silhouette segment for an unknown type of face.

20. The computer-readable medium of claim 18, wherein performing the linear interpolation comprises performing the linear interpolation along a first edge of the silhouette polygon and a second edge of the silhouette polygon, and wherein the third edge of the silhouette polygon is bounded by the two vertices for which the silhouette functions have a same sign.

\* \* \* \* \*